United States Patent [19]

Holmes

[11] 4,441,647

[45] Apr. 10, 1984

[54] RESOLDERING TOOL FOR CERAMIC SUBSTRATE HYBRID ELECTRONIC CIRCUITS

[75] Inventor: Gordon J. Holmes, West Palm Beach, Fla.

[73] Assignee: Northern Telecom Limited, Montreal, Canada

[21] Appl. No.: 385,050

[22] Filed: Jun. 4, 1982

[51] Int. Cl.³ .............................................. B23K 1/00
[52] U.S. Cl. .................................... 228/119; 228/19; 228/51; 228/191; 228/264
[58] Field of Search ...................... 228/19, 20, 51, 101, 228/119, 191, 264; 29/403.4, 402.03, 402.08, 402.11

[56] References Cited

U.S. PATENT DOCUMENTS

| | | | |
|---|---|---|---|
| 3,050,612 | 8/1962 | Eversole | 228/51 X |
| 3,058,440 | 10/1962 | Berry | 228/19 |
| 3,815,806 | 6/1974 | Paxton | 228/264 X |
| 3,879,836 | 4/1975 | Coffin | 228/264 |
| 4,136,444 | 1/1979 | Durney | 228/264 |
| 4,152,822 | 5/1979 | Duff | 228/191 X |
| 4,193,160 | 3/1980 | Vandermark | 228/20 |

OTHER PUBLICATIONS

Desoldering-Soldering Apparatus, by V. A. Corsaro, Technical Digest No. 33, 1974, pp. 25-26.

Primary Examiner—Gus T. Hampilos
Assistant Examiner—M. Jordan
Attorney, Agent, or Firm—Schwwartz, Jeffery, Schwaab, Mack, Blumenthal & Koch

[57] ABSTRACT

A reworking tool for ceramic substrate hybrid circuits has a metal base for sitting on a heated surface, a support member support above the base and a pillar of heat conductive material attached to the base and extending up through an aperture in the support member. The top surfaces of pillar and support member are in a common plane. By this means a "hot spot" is produced at the top of the pillar and a hybrid circuit positioned on the support member can be so positioned that a particular component position is resting on the top of the pillar. Solder at this component position will melt and a component can be removed, or a component added or a component removed and another placed in position. Lateral sliding of the hybrid circuit laterally on the support member enables the solder to solidify.

9 Claims, 4 Drawing Figures

RESOLDERING TOOL FOR CERAMIC SUBSTRATE HYBRID ELECTRONIC CIRCUITS

BACKGROUND OF THE INVENTION

This invention relates to a tool for use with ceramic substrate hybrid electronic circuits, generally referred to as "hybrids", and is particularly concerned with enabling a device or component to be removed from the substrate, without interfering with any other component.

Components and devices are surface soldered to a circuit on the top surface of the substrate. The circuit, and some of the devices, are formed on the substrate by the well known thick film process. Components or devices are surface soldered to the circuit, and interconnections between parts of the circuit, or between circuit and component or device can also be made by surface soldered interconnects.

It can occur that a component is faulty. To reduce the overall space or area of the substrate to a minimum, components are closely spaced. This makes it at least very difficult to use a heat source such as a soldering iron or similar member to melt the solder locally. Damage can readily be caused to another component.

SUMMARY OF THE INVENTION

The present invention provides a tool, or an apparatus, used in conjunction with any suitable form of conventional hot plate, in which a hot spot is created, over which a "hybrid" can be placed, the "hybrid" positioned so that the particular component concerned is over the hot spot, the ceramic substrate in contact with the hot spot. The solder is locally melted enabling the component to be removed. If desired another component can be placed in the position, prior to removal of the "hydrid". Alternatively, if the "hybrid" is removed from the hot spot after removal of a component, repositioning of the "hybrid" will enable a new component to be soldered, by reflow of the solder.

The tool comprises a heat conductive base to which is attached a pillar of heat conductive material. A support member is supported above the base at the same level as the top surface of the pillar, the top of the pillar being positioned in an aperture in the support member. The top surface of the pillar is shaped to provide an area which may be the same as or of reduced dimension relative to the cross-sectional area of the pillar, to provide a hot spot area of desired dimensions.

Conveniently, the base is of aluminum, as is the pillar and the support member. Other metals with a high heat conductance can be used, for example copper, but aluminum is relatively cheap. The support member is supported from the base by distance members, and a heat shield member can be interposed between the base and the support member. This can also be of aluminum.

The invention will be readily understood by the following description of an embodiment, by way of example, in conjunction with the accompanying drawings, in which:

DESCRIPTION OF THE PREFERRED EMBODIMENT

Figure 1:
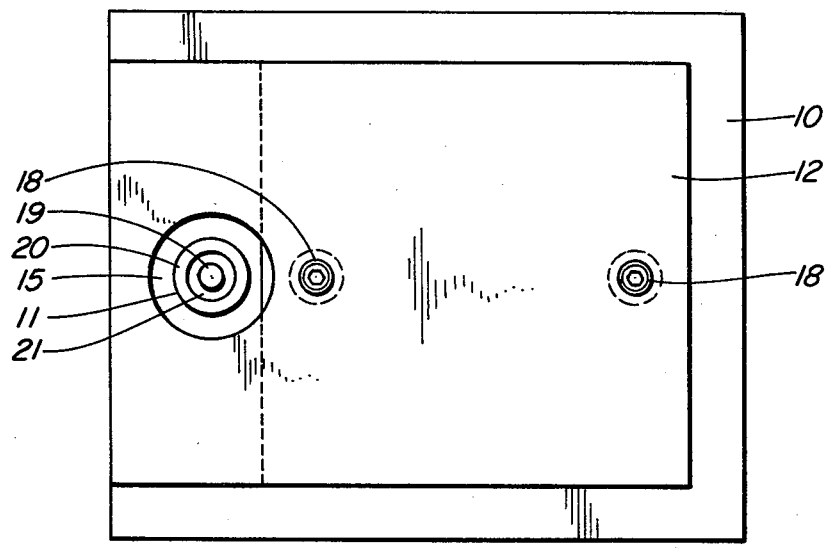
FIG. 1 is a top plan view of a tool.
Figure 2:
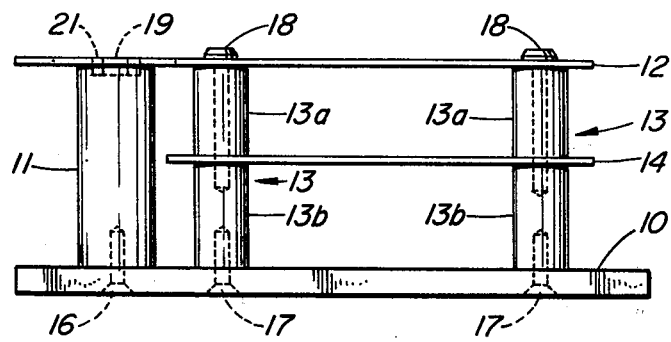
FIG. 2 is a side view of the tool of FIG. 1.
Figure 3:
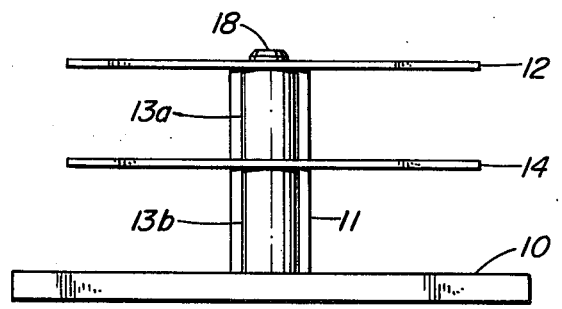
FIG. 3 is an end view in the direction of arrow A in FIG. 1.

As illustrated in the drawings, the tool comprises a base 10, a pillar 11 extending up from the base, and a support member 12 spaced from the base 10 by two mounting members 13. In the particular example illustrated, the mounting members are each in two parts, top parts 13a and bottom parts 13b. A shield member 14 is positioned between the top and bottom parts of each mounting member.

An aperture 15 in the support member 12 provides a clearance around the top of the pillar 11, the top surface of the support member and top surface of the pillar being in the same plane.

In the example, the pillar 11 is attached to the base by a countersunk screw 16. The bottom parts 13b of the mounting members are attached to the base by countersunk screws 17 and the support member 12 top parts 13a of the mounting members and the shield member 14 are attached to the bottom parts of the mounting members by screws 18 which pass through the support member 12 top parts 13a and shield member 14, screwing into the bottom parts 13b.

The top of the pillar 11, in the example, is formed with a central peg member 19 surrounded by an annular portion 20. The annular portion is spaced from the peg member 19 by an annular well 21. However, this is an optional form of construction, as the top of the pillar 11 can be completely flat, of the same dimensions as the remainder of the pillar. Also a central peg member without the annular portion can be provided.

Figure 4:
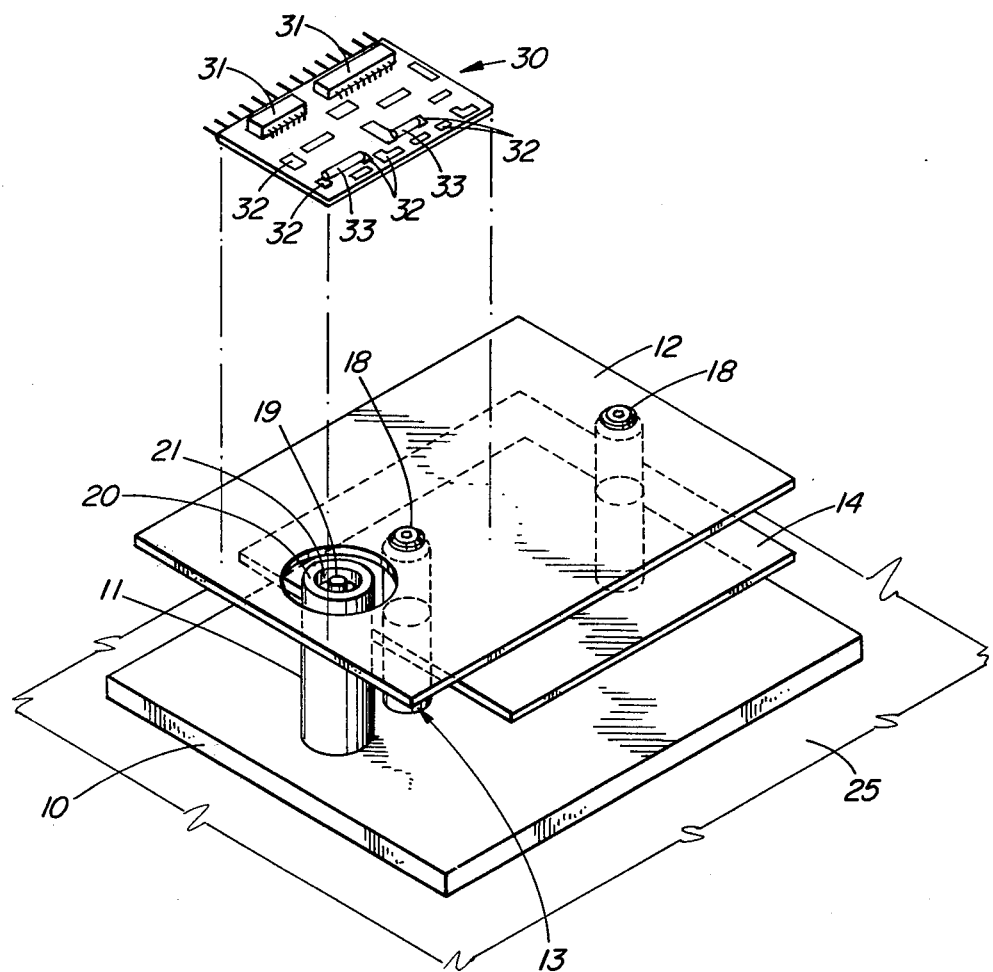
FIG. 4 is a perspective view of the tool of FIGS. 1, 2 and 3, also illustrating the positioning of a "hybrid" on the tool.

In use the base 10 is placed on a hot surface, indicated at 25 in FIG. 4. A typical temperature for the hot surface is 800° F. With the tool as illustrated, a temperature differential of about 400° F. was obtained, that is the temperature at the top surface peg member is about 500° F. while the temperature of the support member 12 is about 100° F. In the example illustrated, the base 10, support member 12, shield member 14 and pillar 11 are all of aluminum. The base 10 is approximately 5" wide and 6" long, ¼" thick. The pillar 11 is ¾" diameter and 2" high, the peg member 19 approximately ¼" diameter with the annular well 21 approximately 1⅛" wide and ⅛" deep. The support member is about 4" wide and 5½" long and the shield member about 4" square. The pillars 13 are of a heat insulating material. The power input to the hot surface is about 750 watts.

Obviously the dimensions of the various parts can be varied and the desired temperature at the hot spot will, to a large extent, determine dimension parameters, the temperature of the hot surface and power requirements.

FIG. 4 also illustrates the use of the tool. A "hybrid" is indicated at 30, carries various components indicated generally at 31 and 32. The components indicated at 32 can be formed by thick film deposition and further components 33 can be surface soldered to contact areas on the components 32. Components 31, 32, are connected, or form parts of, a printed circuit, not shown in FIG. 4 for clarity. The further components 33 can be electronic components or interconnections. It can occur that a component 31, 32 or 33, if an electronic component, is faulty. It may therefore be necessary to replace this component. It may be desired to replace one type of component with another, or merely add a component or remove a component.

If such a change is required, the "hybrid" is placed on the support member 12, with the particular component position resting on the peg member 19. Heat will be transmitted through the ceramic substrate and melt solder at the particular position. A component at that position can be removed with tweezers and another component put in its place. After a short wait, the "hybrid" can then be slid sideways on to the main portion of the support member 12 to cool. This procedure can be used for replacing components, removing components, changing components and adding components. If a component is added, either some solder must be already in place at the particular position, or solder must be provided. This can readily be obtained by putting some solder on the component.

The invention provides a very simple but effective tool for reworking hybrids without causing damage to other components or devices not directly involved. Repair of faulty "hybrids" is quick and easy. Changes to the "hybrid" circuit can also be easily made—a useful feature for experimental and other purposes.

What is claimed is:

1. A resoldering tool for reworking ceramic substrate hybrid electronic circuits, comprising:
   a heat conductive base;
   a support member supported above said base, and an aperture in said support member;
   a pillar of heat conductive material attached to said base and extending up therefrom, said pillar extending through said aperture, an upper surface of said support member and an upper surface of said pillar in a common plane, a clearance extending between said pillar and said support member; said heat conductive base adapted to be positioned on a hot surface, to produce a hot spot at said upper surface of said pillar.

2. A tool as claimed in claim 1, said upper surface of said pillar including a central peg member, an annular well surrounding the peg member, and an annular portion around said well.

3. A tool as claimed in claim 1, including a sheild member positioned between said base and said support member.

4. A tool as claimed in claim 1, said support member supported above said base on a plurality of spaced apart pillars of heat insulating material.

5. A tool as claimed in claim 4, said spaced apart pillars each comprising a top part and a bottom part, and a shield member positioned between said base and said support member, said shield member supported between said top and bottom parts of said spaced apart pillars.

6. A method of reworking a ceramic substrate hybrid circuit member on a tool as claimed in claim 1, comprising positioning said ceramic substrate on said support member;
   positioning said ceramic substrate with a predetermined area on said substrate over said upper surface of said pillar, and melting solder at a predetermined area.

7. A method as claimed in claim 6, including removing a component at said predetermined area and moving said substrate laterally on said support member.

8. A method as claimed in claim 6, including positioning a component at said predetermined area and moving said substrate laterally on said support member.

9. A method as claimed in claim 6, including removing a component at said predetermined area, positioning a further component at said predetermined area, and moving said substrate laterally on said support member.

* * * * *